(12) United States Patent  
Makala et al.

(10) Patent No.: US 9,397,093 B2
(45) Date of Patent: Jul. 19, 2016

(54) THREE DIMENSIONAL NAND DEVICE WITH SEMICONDUCTOR, METAL OR SILICIDE FLOATING GATES AND METHOD OF MAKING THEREOF

(71) Applicant: SanDisk Technologies, Inc., Plano, TX (US)

(72) Inventors: Raghuveer S. Makala, Sunnyvale, CA (US); Johann Alsmeier, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 130 days.

(21) Appl. No.: 13/762,988

(22) Filed: Feb. 8, 2013

(65) Prior Publication Data

US 2014/0225181 A1 Aug. 14, 2014

(51) Int. Cl.
*H01L 21/336* (2006.01)
*H01L 27/088* (2006.01)
*H01L 29/66* (2006.01)
*H01L 21/8239* (2006.01)

(Continued)

(52) U.S. Cl.
CPC ........ *H01L 27/088* (2013.01); *H01L 21/28273* (2013.01); *H01L 21/28282* (2013.01); *H01L 21/8221* (2013.01); *H01L 21/8239* (2013.01); *H01L 27/11556* (2013.01); *H01L 29/66825* (2013.01); *H01L 29/7889* (2013.01)

(58) Field of Classification Search
CPC ................... H01L 21/28273; H01L 21/28282; H01L 21/8221; H01L 21/8239

USPC .................. 438/264, 266, 267, 270, 277, 280
See application file for complete search history.

(56) References Cited

U.S. PATENT DOCUMENTS

| 5,084,417 A | 1/1992 | Joshi et al. |
| 5,807,788 A | 9/1998 | Brodsky et al. |

(Continued)

FOREIGN PATENT DOCUMENTS

| WO | WO02/15277 A2 | 2/2002 |
| WO | WO 2009/084206 A1 | 7/2009 |

OTHER PUBLICATIONS

International Search Report & Written Opinion received in connection with international application No. PCT/US2014/013117, mailed May 13, 2014.

(Continued)

*Primary Examiner* — Matthew E Warren
(74) *Attorney, Agent, or Firm* — The Marbury Law Group PLLC

(57) ABSTRACT

A method of making a monolithic three dimensional NAND string includes forming a stack of alternating layers of a first material and a second material, etching the stack to form a front side opening in the stack, selectively forming a plurality of discrete semiconductor, metal or silicide charge storage regions on portions of the second material layers exposed in the front side opening, forming a tunnel dielectric layer and semiconductor channel layer in the front side opening, etching the stack to form a back side opening in the stack, removing at least a portion of the second material layers through the back side opening to form back side recesses between the first material layers, forming a blocking dielectric in the back side recesses through the back side opening, and forming control gates over the blocking dielectric in the back side recesses through the back side opening.

17 Claims, 8 Drawing Sheets

(51) Int. Cl.
*H01L 21/28* (2006.01)
*H01L 21/822* (2006.01)
*H01L 29/788* (2006.01)
*H01L 27/115* (2006.01)

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0148237 | A1 | 6/2010 | Kito et al. |
| 2010/0155810 | A1* | 6/2010 | Kim et al. ............ 257/316 |
| 2010/0155818 | A1 | 6/2010 | Cho |
| 2010/0181610 | A1 | 7/2010 | Kim et al. |
| 2010/0207193 | A1 | 8/2010 | Tanaka et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0147824 | A1 | 6/2011 | Son et al. |
| 2011/0266606 | A1 | 11/2011 | Park et al. |
| 2011/0294290 | A1* | 12/2011 | Nakanishi ......... H01L 27/11551 438/666 |
| 2012/0001247 | A1* | 1/2012 | Alsmeier ............ 257/316 |
| 2012/0001249 | A1 | 1/2012 | Alsmeier |
| 2012/0184078 | A1 | 7/2012 | Kiyotoshi |
| 2012/0217564 | A1 | 8/2012 | Tang et al. |
| 2013/0059422 | A1* | 3/2013 | Lee et al. ............ 438/268 |
| 2013/0237025 | A1* | 9/2013 | Yang .................. 438/268 |
| 2013/0292757 | A1* | 11/2013 | Aritome .............. 257/316 |
| 2014/0061770 | A1* | 3/2014 | Lee et al. ............ 257/324 |

OTHER PUBLICATIONS

International Search Report & Written Opinion issued in PCT Application No. PCT/US2012/032870, mailed on Jun. 27, 2012.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

U.S. Appl. No. 13/443,287, Johann Alsmeier et al., "Vertical NAND Device with Low Capacitance and Silicided Word Lines," filed Apr. 10, 2012, Specification and drawings.

U.S. Appl. No. 13/478,483, Yao-Sheng Lee et al., Multi-Level Contact to a 3D Memory Array and Method of Making, filed May 23, 2012, Specification and drawings.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

U.S. Appl. No. 13/544,328, Raghuveer S. Makala et al, "Three Dimensional NAND Device and Method of Charge Trap Layer Separation and Floating Gate Formation in the Nand Device", filed Jul. 9, 2012, Specification and drawings.

U.S. Appl. No. 13/083,775, Johann Alsmeier, "3D Vertical NAND and Method of Making Thereof by Front and Back Side Processing", filed Apr. 11, 2011, Specification and drawings.

U.S. Appl. No. 13/443,287, Johann Alsmeier et al., "Vertical NAND Device with Low Capacitance and Silicided Word Lines", filed Apr. 10, 2012, Specification and drawings.

J. Ooshita, Toshiba Announces 32Gb 3D-Stacked Multi-Level NAND Flash, 3 pages, htto://techon.nikkeibp.co.jp/english/NEWS_EN/20090619/171977/ Nikkei Microdevices, Tech-On, Jun. 19, 2009.

U.S. Appl. No. 13/754,293, Johann Alsmeier et al., "Compact Three Dimensional Vertical NAND and Method of Making Thereof", filed Jan. 30, 2013, Specification and drawings.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

* cited by examiner

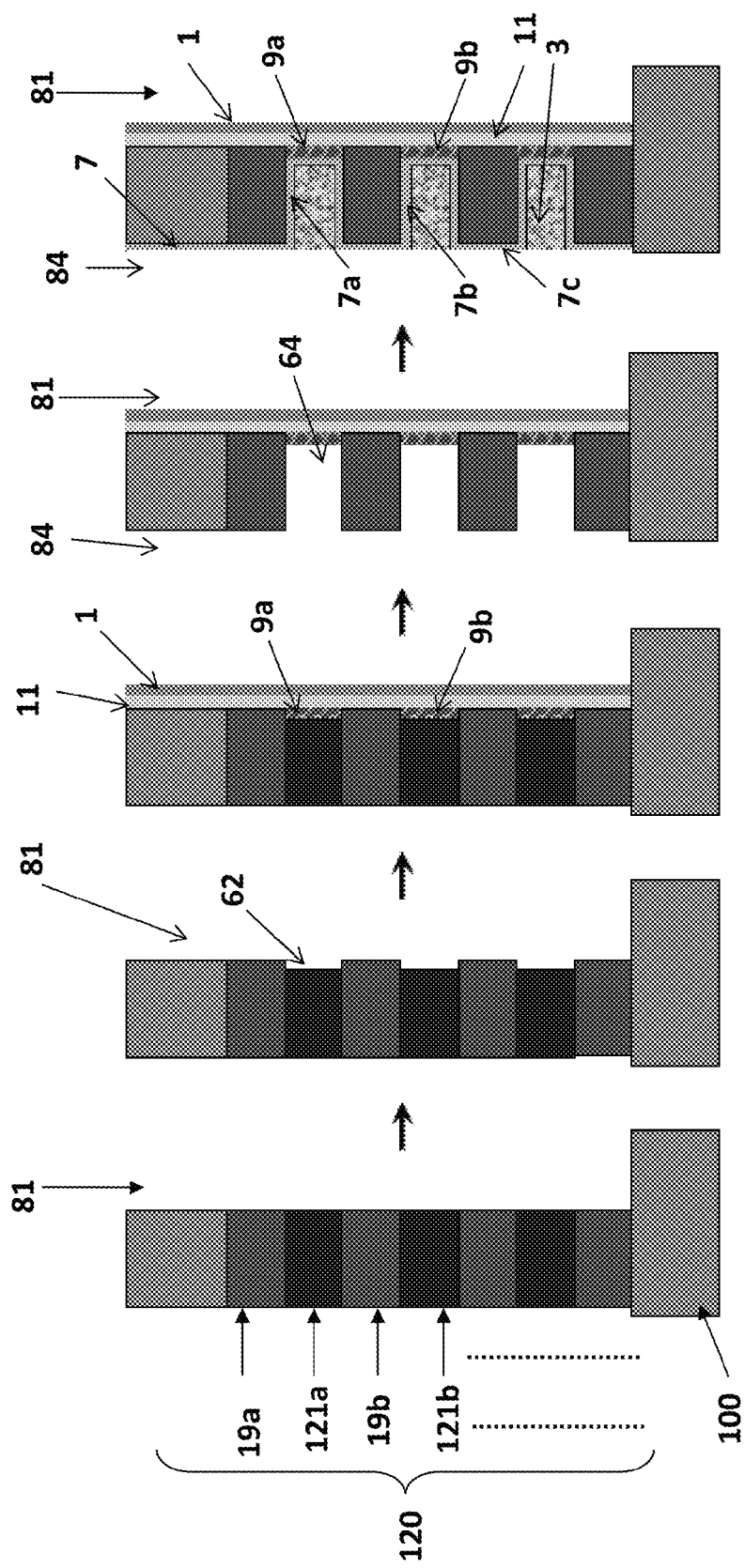

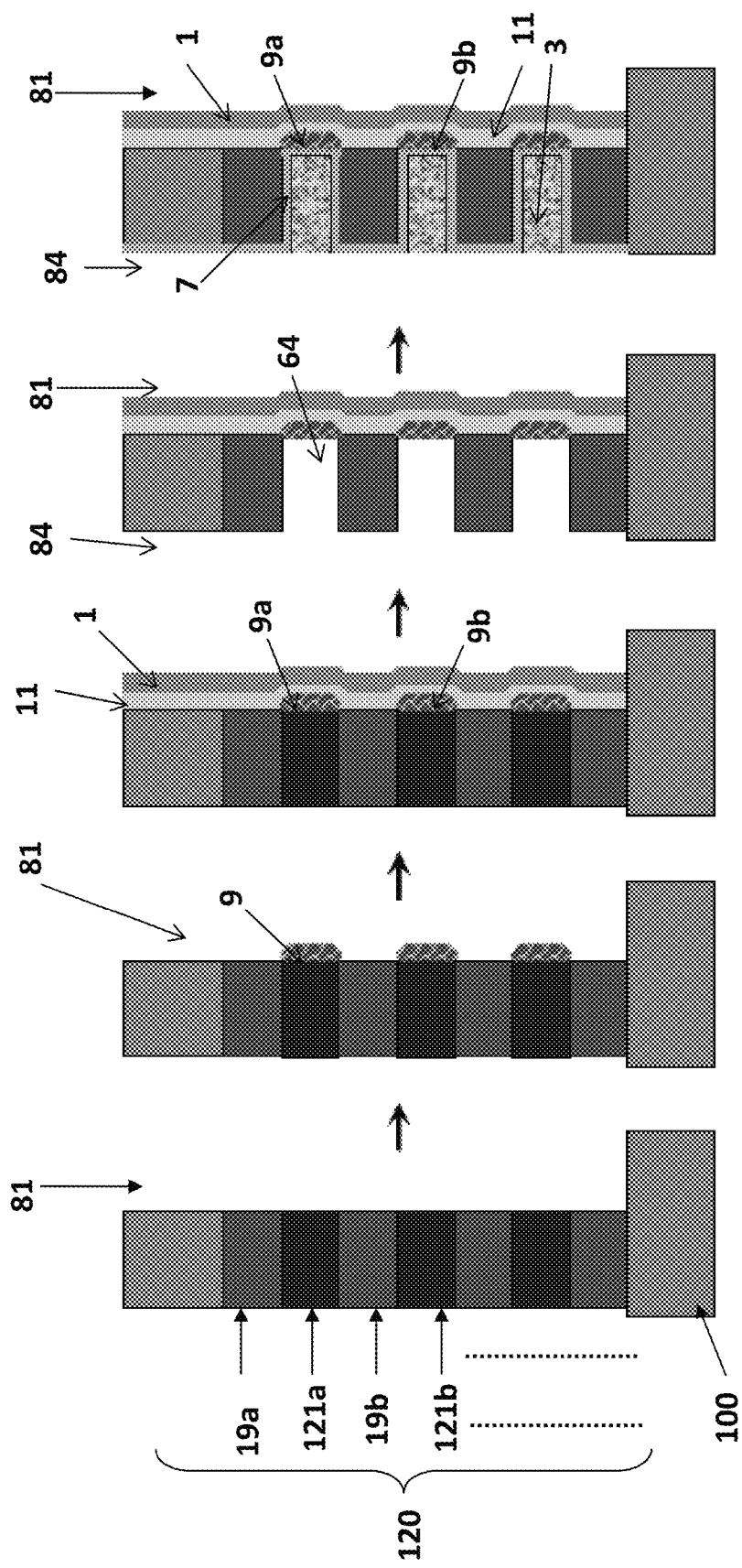

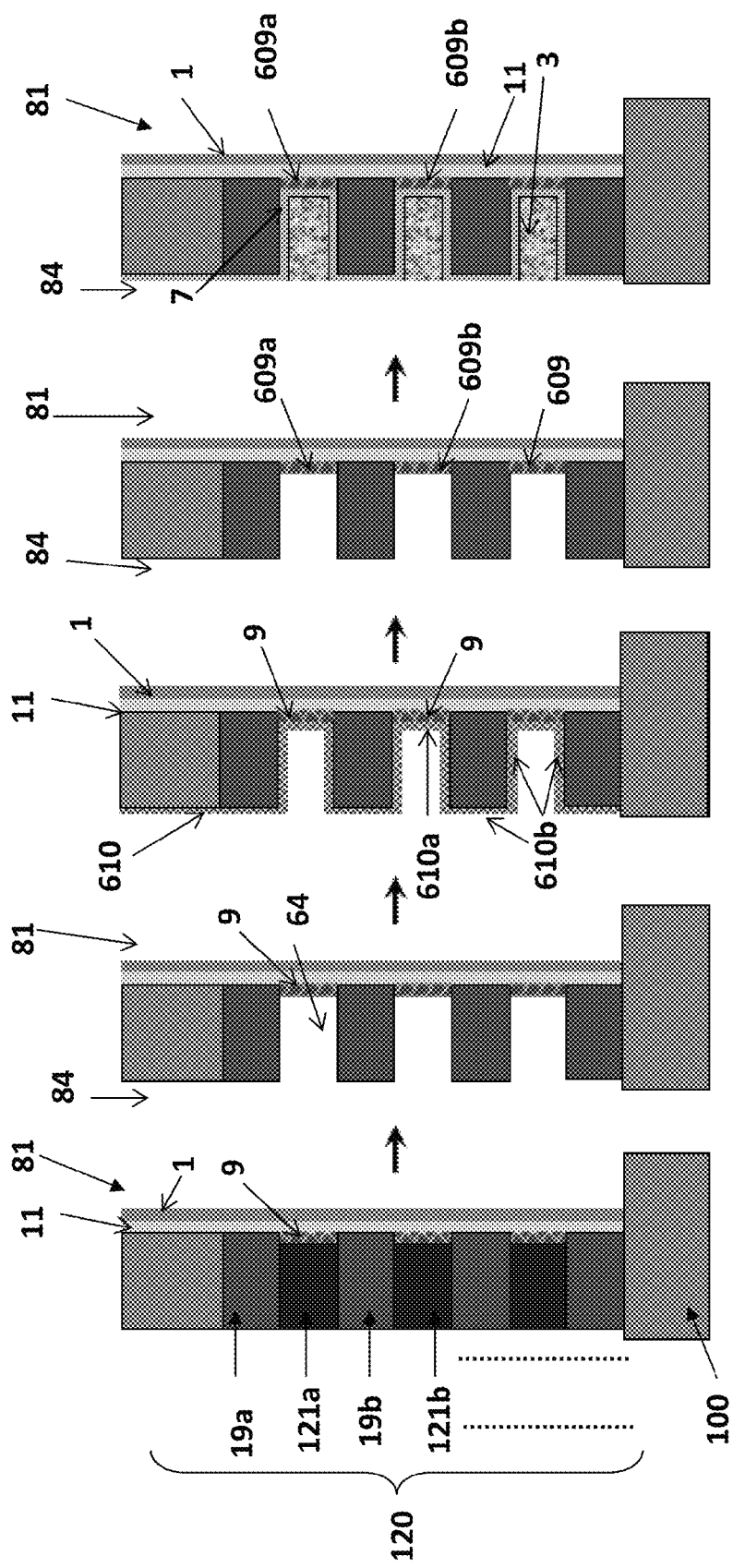

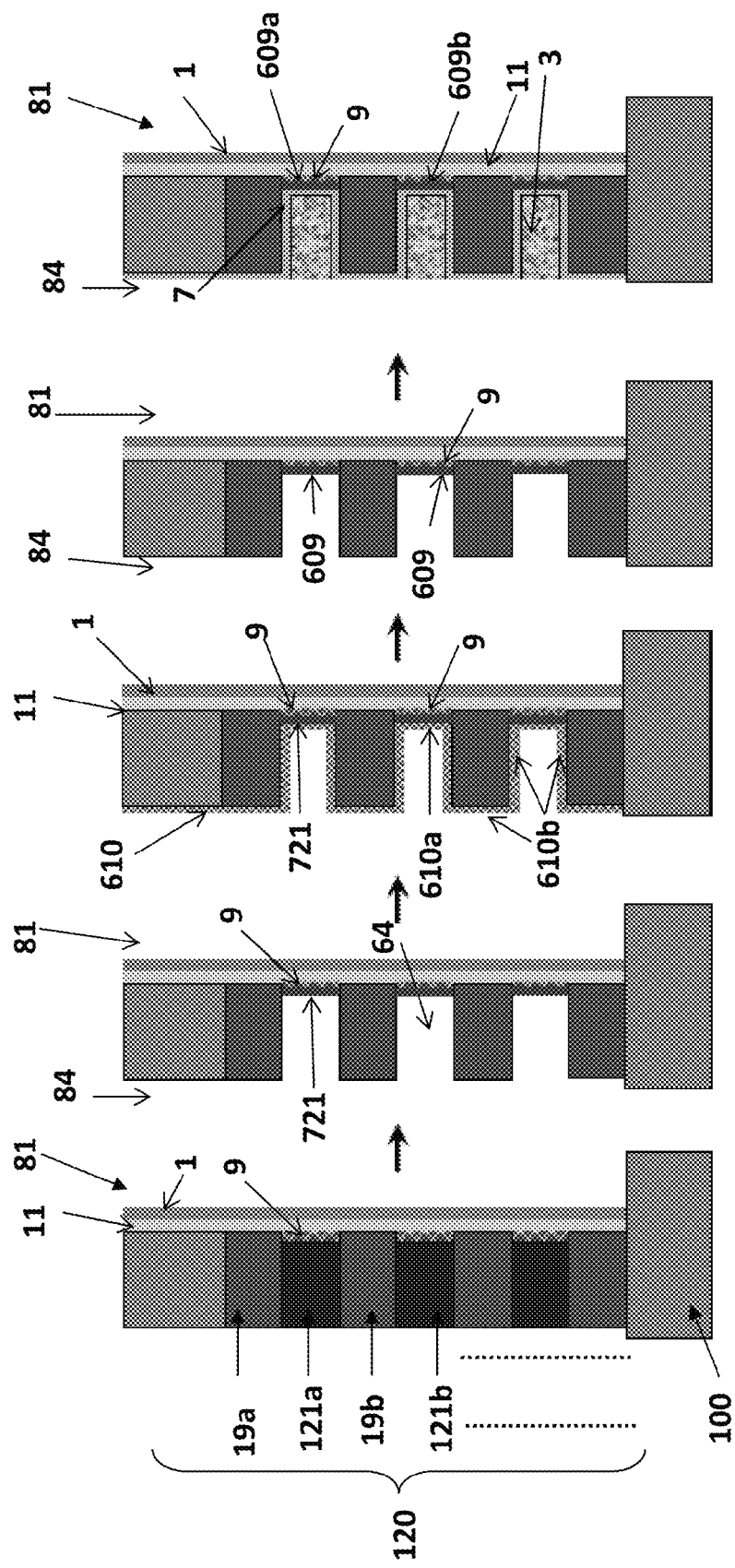

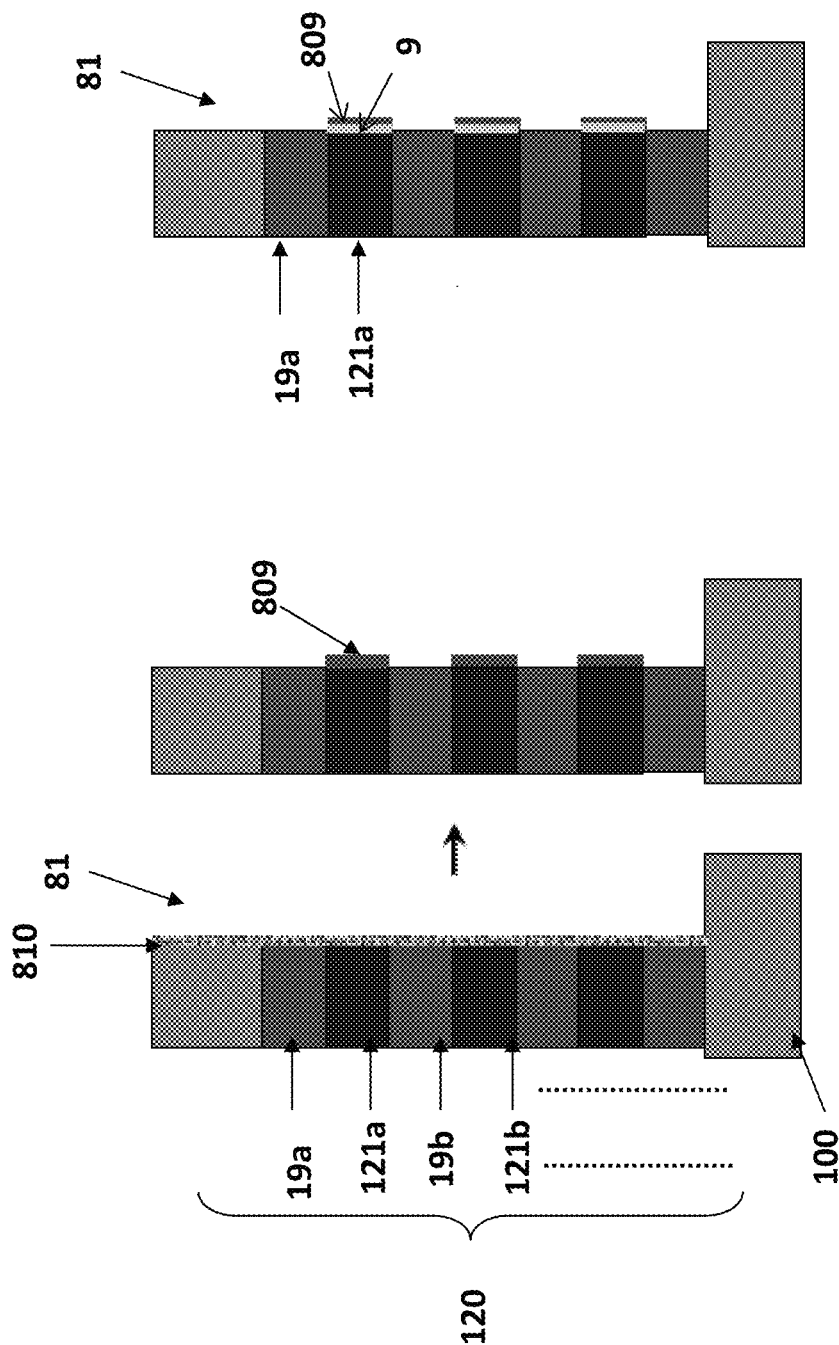

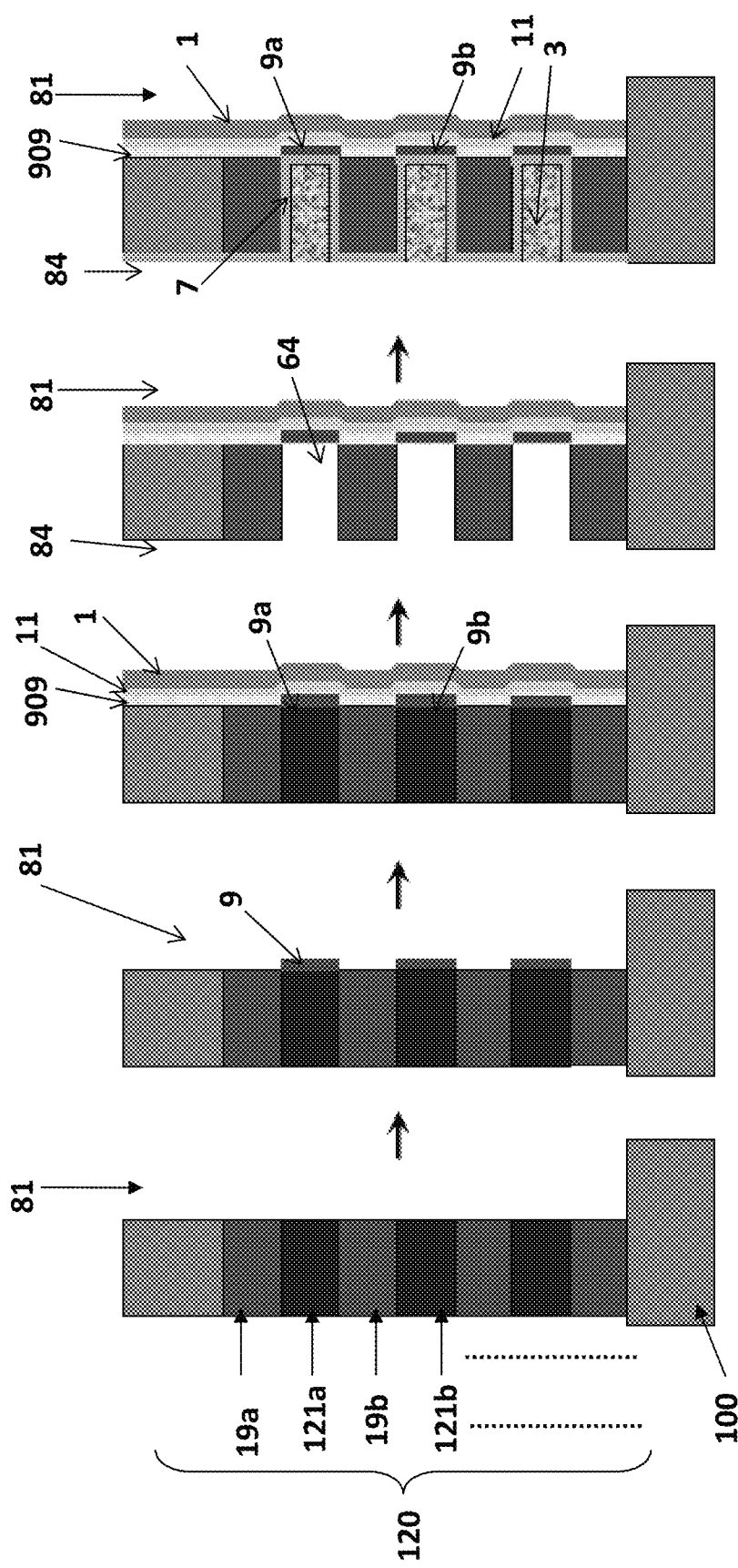

THREE DIMENSIONAL NAND DEVICE WITH SEMICONDUCTOR, METAL OR SILICIDE FLOATING GATES AND METHOD OF MAKING THEREOF

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string, which includes forming a stack of alternating layers of a first material and a second material, where the first material comprises an electrically insulating material and wherein the second material comprises a sacrificial material, etching the stack to form a front side opening in the stack, selectively forming a plurality of discrete semiconductor, metal or silicide charge storage regions on portions of the second material layers exposed in the front side opening, forming a tunnel dielectric layer over the charge storage regions in the front side opening, forming a semiconductor channel layer over the tunnel dielectric layer in the front side opening, etching the stack to form a back side opening in the stack, removing at least a portion of the second material layers through the back side opening to form back side recesses between the first material layers, forming a blocking dielectric in the back side recesses through the back side opening, and forming control gates over the blocking dielectric in the back side recesses through the back side opening.

Another embodiment relates to a monolithic three dimensional NAND string including a semiconductor channel, at least one end portion of the semiconductor channel extending substantially perpendicular to a major surface of a substrate, a plurality of control gate electrodes having a strip shape extending substantially parallel to the major surface of the substrate, where the plurality of control gate electrodes comprise at least a first control gate electrode located in a first device level and a second control gate electrode located in a second device level located over the major surface of the substrate and below the first device level, a blocking dielectric located in contact with the plurality of control gate electrodes, a plurality of vertically spaced apart charge storage regions, wherein the plurality of vertically spaced apart charge storage regions comprise at least a first spaced apart charge storage region located in the first device level and a second spaced apart charge storage region located in the second device level, and a tunnel dielectric located between each one of the plurality of the vertically spaced apart charge storage regions and the semiconductor channel. The NAND string comprises at least one of:

(a) the plurality of vertically spaced apart charge storage regions protrude into the tunnel dielectric such that the tunnel dielectric and the semiconductor channel curve around the plurality of vertically spaced apart charge storage regions;

(b) the plurality of vertically spaced apart charge storage regions comprise a nitrided metal; or (c) a continuous dielectric charge storage layer is located in contact with the plurality of vertically spaced apart charge storage regions.

BRIEF DESCRIPTION OF THE DRAWINGS

FIG. 1A is a side cross sectional view of the device along line Y-Y' in FIG. 1B, while FIG. 1B is a side cross sectional view of the device along line X-X' in FIG. 1A.

FIG. 2A is a side cross sectional view of the device along line Y-Y' in FIG. 2B, while FIG. 2B is a side cross sectional view of the device along line X-X' in FIG. 2A.

FIGS. 4A-4E, 5A-5E, 6A-6E, 7A-7E, 8A-8C and 9A-9E are side cross sectional views illustrating embodiments of methods of making the NAND strings illustrated in FIGS. 1-3.

DETAILED DESCRIPTION

The embodiments of the invention provide a monolithic, three dimensional array of memory devices, such as an array of vertical NAND strings having selectively formed, discreet metal, semiconductor or silicide charge storage regions. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 1A:
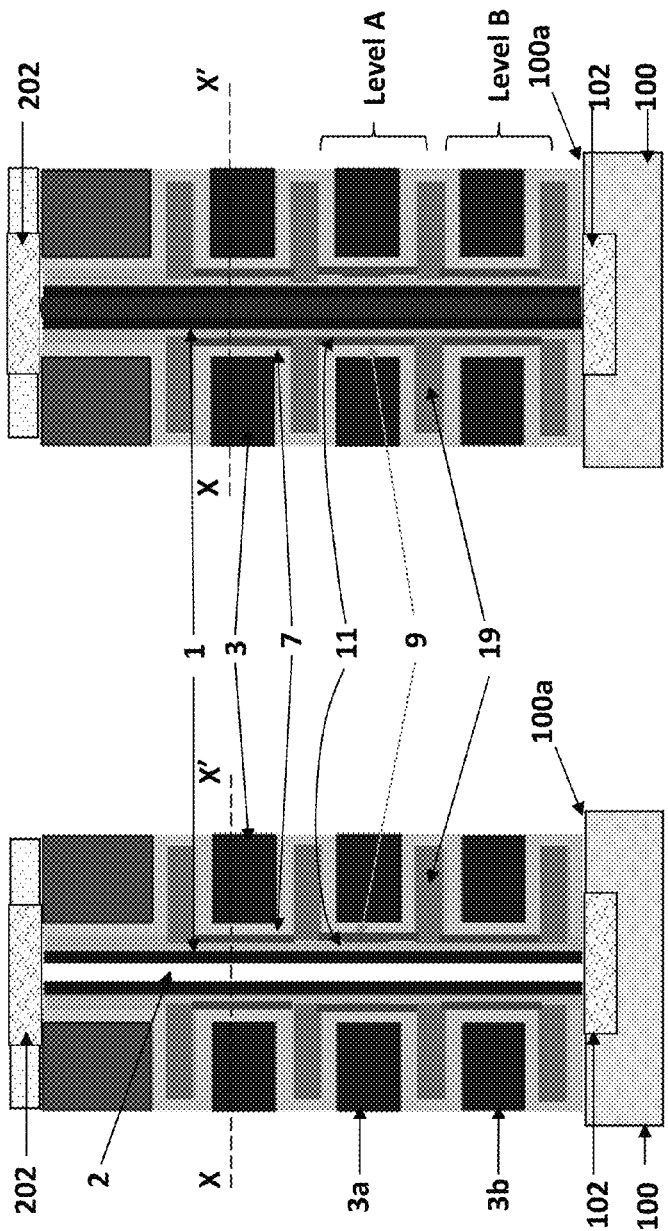
FIGS. 1A-1B are respectively side cross sectional and top cross sectional views of a NAND string of one embodiment.
Figure 1B:
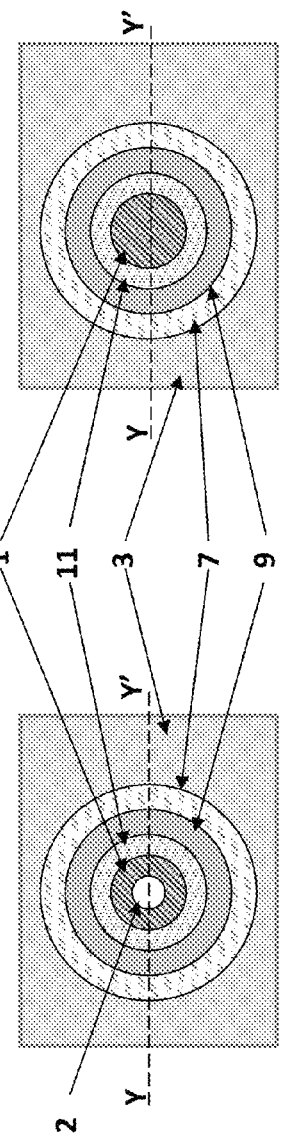
Figure 2A:
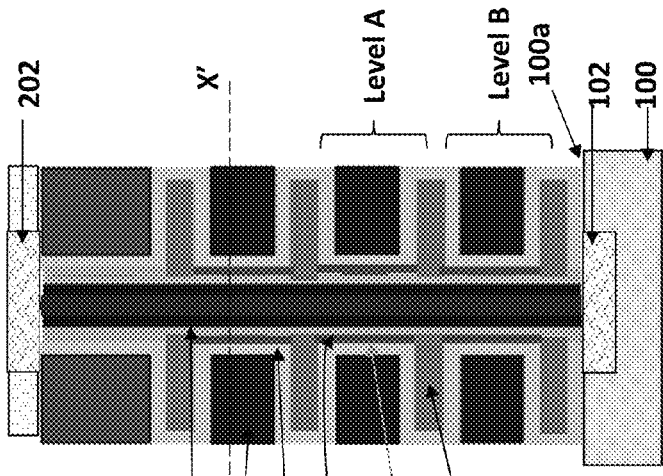
FIGS. 2A-2B are respectively side cross sectional and top cross sectional views of a NAND string of another embodiment.

In some embodiments, the monolithic three dimensional NAND string 180 comprises a semiconductor channel 1 having at least one end portion extending substantially perpendicular to a major surface 100a of a substrate 100, as shown in FIGS. 1A and 2A. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3 for clarity.

Figure 2B:
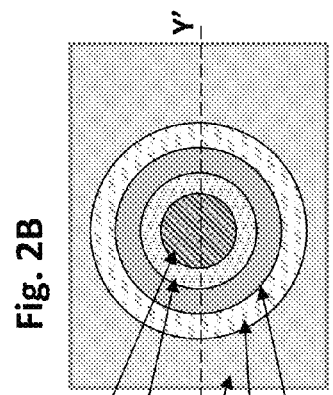
Figure 3:
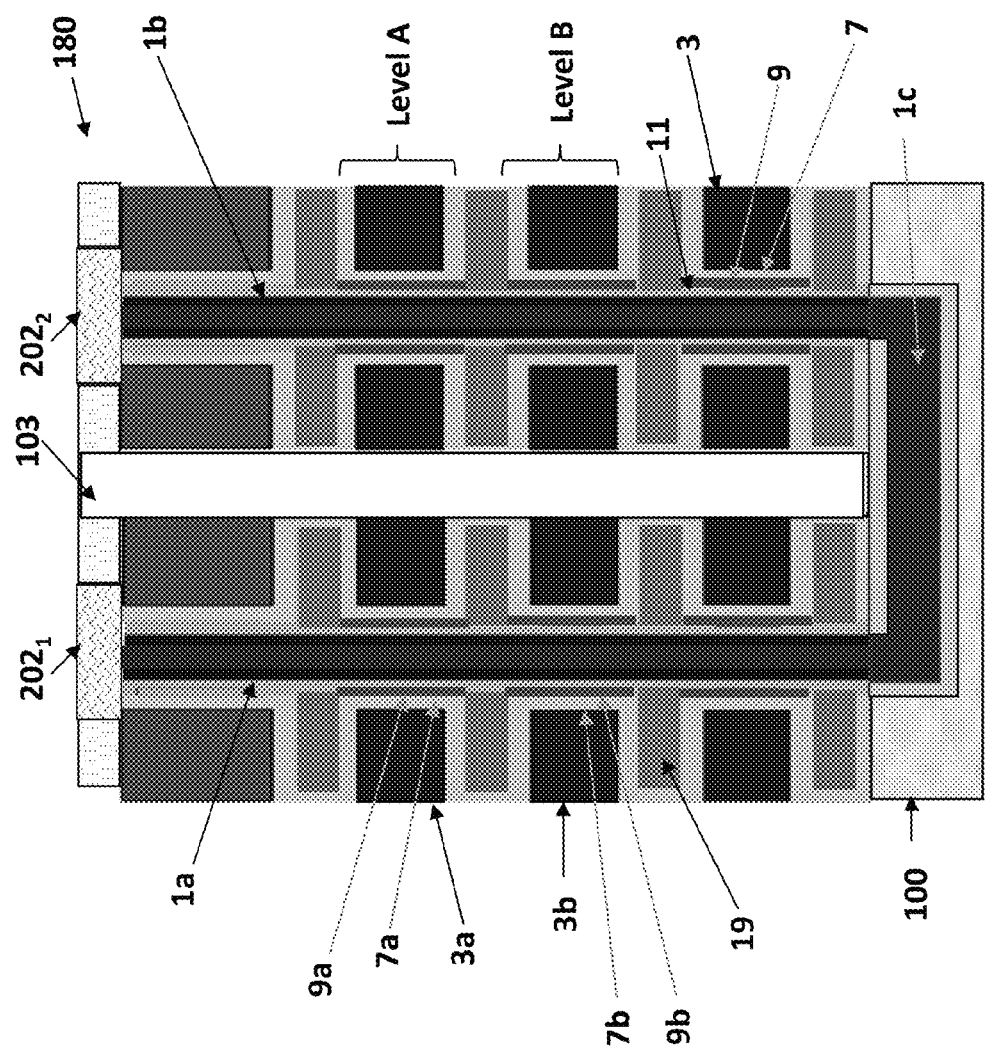
FIG. 3 is side cross sectional view of a NAND string of an embodiment with a U-shaped channel.

In some embodiments, the semiconductor channel 1 may be a filled feature, as shown in FIGS. 2A-2B and 3. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof.

A blocking dielectric 7 is located adjacent to the control gate(s) 3 and may surround the control gate 3. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3.

The monolithic three dimensional NAND string also comprise a plurality of discrete charge storage regions or segments 9 located between the blocking dielectric 7 and the channel 1. Similarly, the plurality of discrete charge storage regions 9 comprise at least a first discrete charge storage region 9a located in the device level A and a second discrete charge storage region 9b located in the device level B, as shown in FIG. 3.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates.

The tunnel dielectric 11 of the monolithic three dimensional NAND string is located between each one of the plurality of the discrete charge storage regions 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIGS. 4A-4E illustrate a method of making a NAND string according to a first embodiment of the invention.

Referring to FIG. 4A, a stack 120 of alternating layers 19 (19a, 19b etc.) and 121 (121a, 121b, etc.) are formed over the major surface of the substrate 100. Layers 19, 121 may be deposited over the substrate by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such a semiconductor material. For example, layers 121 may comprise silicon, such as amorphous silicon or polysilicon, or another semiconductor material, such as a group IV semiconductor, including silicon-germanium and germanium. Preferably, layers 121 comprise intrinsic or undoped (if the as-deposited material inherently has a low p-type or n-type conductivity) semiconductor material, such as intrinsic or undoped polysilicon or amorphous silicon. However, p-type or n-type doped semiconductor materials, such as lightly or heavily doped materials may also be used if desired. The term heavily doped includes semiconductor materials doped n-type or p-type to a concentration of above $10^{18}$ cm$^{-3}$. In contrast, lightly doped semiconductor materials have a doping concentration below $10^{18}$ cm$^{-3}$ and intrinsic semiconductor materials have a doping concentration below $10^{15}$ cm$^{-3}$.

The deposition of layers 19, 121, is followed by etching the stack 120 to form at least one a front side opening 81 in the stack 120. An array of a front side openings 81 (e.g., memory holes) may be formed in locations where vertical channels of NAND strings will be subsequently formed. The openings 81 may be formed by photolithography and etching.

Next, in an optional step as shown in FIG. 4B, the second material 121 is selectively etched compared to the first material 19 to form front side recesses 62 in the second material 121 (i.e., layers 121a, 121b, etc). The recesses 62 may be formed by selective, isotropic wet or dry etching which selectively etches the second material 121 compared to the first material 19. The depth of each recess 62 may be 3 to 20 nm. As will be described below, this step may be omitted if desired.

As shown in FIG. 4C, a plurality of discrete semiconductor, metal or silicide charge storage regions 9 are selectively formed on portions of the second material layers 121 exposed in the front side opening 81. The charge storage regions 9 comprise a plurality of charge storage segments or regions (e.g., 9a and 9b) located on the exposed edges of the second material 121 in the front side recesses 62.

In one embodiment, the charge storage regions 9 are selectively formed by selective growth of the regions on the exposed edges of the semiconductor second material layers 121 but not on the exposed insulating first material layers 19. Any suitable selective growth methods may be used to form the charge storage regions 9, such as chemical vapor deposition.

In one aspect of the selective growth embodiment, charge storage regions 9 comprise doped polysilicon regions which are selectively grown by CVD on the portions of the undoped or intrinsic second material layers 121 (e.g., undoped or intrinsic semiconductor having a polycrystalline or amorphous structure, such as polysilicon, amorphous silicon, silicon germanium or germanium) exposed in the front side opening 81. For example, the doped polysilicon regions 9 may comprise boron doped, p-type polysilicon regions (e.g., lightly or heavily doped) which are selectively, epitaxially grown on polysilicon layer 121 edges exposed in the front side openings 81. The doped polysilicon regions 9 are not grown on portions of the first material layers 19 (e.g., silicon oxide) exposed in the front side opening 81.

Any suitable silicon selective epitaxial growth (SEG) conditions may be used to form regions 9. For example, a chemical vapor deposition (CVD) SEG process which combines a silicon source gas and a silicon growth inhibitor gas which inhibits silicon growth on the oxide layers 19 may be used. Exemplary silicon source gases include silane and chlorosilanes (e.g., SiH$_4$, SiH$_2$Cl$_2$, and/or SiHCl$_3$). Exemplary inhibitor gases which inhibit silicon growth on SiO$_2$ include HCl and/or Cl$_2$. H$_2$ may be used as a carrier gas while B$_2$H$_6$, AsH$_3$ and/or PH$_3$ gases may be added to introduce dopants to the silicon regions 9. Any suitable SEG temperatures and pressures may be used, such as a temperature of 500 to 800 C and a pressure of 10 mTorr to 100 Torr (i.e., LPCVD). Similar process conditions may be used to form germanium or silicon-germanium charge storage regions 9, where germane (GeH$_4$) is substituted for silane or provided in addition to silane, at lower temperatures (e.g., 340 to 380 C) and pressure of about 10 mTorr–5 Torr, such as about 1 Torr.

In another aspect of the selective growth embodiment, charge storage regions 9 comprise selectively grown metal or silicide charge storage regions, such as on the portions of the second material layers exposed in the front side opening. Any metal (i.e., pure metal or conductive metal alloy) or metal silicide which may be selectively grown on exposed semiconductor layer 121 in the opening 81 may be used. For example, the charge storage regions 9 may comprise selectively grown tungsten, molybdenum or tantalum regions that are selectively grown on the semiconductor material (e.g., silicon) 121 but not on insulating material (e.g., silicon oxide) 19 from a metal halide source gas (e.g., tungsten hexafluoride) in a CVD process.

Selective deposition of refractory metals, such as W, Mo or Ta, on silicon may be performed by metal halide source gas reduction by SiH$_4$, where a ratio of SiH$_4$ to metal halide is less than one. For example, as disclosed in U.S. Pat. Nos. 5,084,417 and 5,807,788, incorporated herein by reference in their entirety, in the selective CVD process, the metal halide source gas may comprise WF$_6$, MoF$_6$ or TaCl$_5$ and the deposition temperature and pressure may range from 370 to 550 C and 100 to 500 mTorr, respectively. The ratio of the SiH$_4$/metal halide flow rates may range between 0.4 and 0.6.

If the front side recesses 62 are present, then the regions 9 may be selectively grown in the front side recesses 62 until their edges are about even with the edges of the insulating material 19 such that they form a relatively straight sidewall of the front side opening 81 (e.g., as much as a timed selective growth permits). Alternatively, the selective growth of regions 9 is terminated before regions 9 completely fill the recesses 62. Thus, regions 9 may partially fill recesses 62 and may remain horizontally recessed in the opening 81 compared to insulating material layers 19. Alternatively, the selective growth of regions 9 is terminated after regions 9 completely fill the recesses 62 such that the regions 9 protrude horizontally into the front side opening 81 past layers 19, as shown in FIG. 5C.

In another embodiment, the regions 9 are selectively formed by doping of the semiconductor layers 121 exposed in the front side opening 81. For example, when layers 121 comprise intrinsic or undoped semiconductor layers, a timed gas phase diffusion doping may be carried out to doped the edge portions 9 of layers 121 facing the opening 81 by providing a doping gas through the opening 81. The doping is terminated before the entire volume of layers 121 are doped, such that portions of layers 121 located behind regions 9 and facing away from the opening 81 remain undoped. For example, for Group IV semiconductor material (e.g., silicon) layers 121, the doping gas may comprise a boron containing gas, such as diborane, to form p-type doped regions 9, or a phosphorus or arsenic containing gas, such as phosphine or arsene, to form n-type doped regions 9.

In the next step shown in FIG. 4C, a tunnel dielectric layer 11 is deposited over the charge storage regions 9a, 9b and the insulating first material layers 19 between the charge storage regions in the front side opening 81. Then, the channel 1 is formed by depositing channel material 1, such as a lightly doped or intrinsic polysilicon over the tunnel dielectric layer 11 in the front side opening 81. If desired, a high temperature anneal may be performed after forming the channel.

As discussed above, the entire opening 81 may be filled to form the device illustrated in FIGS. 2A and 2B. Alternatively, a layer of channel material may first be deposited in the opening 81 followed by deposition of an insulating fill material 2 to form the device illustrated in FIGS. 1A and 1B. If desired, the channel 1 may be U-shaped as illustrated in FIG. 3.

The channel 1 may be formed by filling the front side opening 81 with a lightly doped semiconductor material (e.g., polysilicon) and then etched back from the top to form the pillar shaped (or U-shaped) channel 1 in the opening 81. In the embodiment of FIG. 3, the space between the wings of the U-channel 1 is filled with a gap fill insulating layer 103, such as silicon oxide or another material. Layer 103 may be formed by etching the stack 120 to form a rail shaped cut, followed by depositing an oxide layer followed by etch back or chemical mechanical polishing to form a planar top surface exposing the top surfaces of the channels 1. The channels are then connected to source and drain electrodes 102, 202 as shown in FIGS. 1-3, the select gate electrodes (not shown for clarity) are connected to select gate contacts and the control gate electrodes 3 are connected to word line contacts as known in the art.

In the next step shown in FIG. 4D, the stack 120 is patterned to form one or more back side openings 84 in the stack. The back side opening(s) 84 may be formed by photolithography and anisotropic etching of the stack. Preferably, the opening(s) 84 have a slit shape.

Then, at least a portion of the second material layers 121 are removed through the back side opening 84 to form back side recesses 64 between the first material layers 19. For example, layers 121 may be removed completely by selective wet etching using a liquid etching medium which selectively etches the material of layers 121 compared to the materials of layers 19 and regions 9. For example, if layers 121 comprise undoped or intrinsic polysilicon, layers 19 comprise silicon oxide and regions 9 comprise doped polysilicon, silicide or metal, then an undoped polysilicon selective etch may be used which stops on doped polysilicon (e.g., p-type polysilicon) regions 9 which act as an etch stop. Alternatively, the selective etch may be a timed etch which is timed to remove only a portion of the sacrificial second material layers 121 through the back side opening 84. In this case, a remaining portion of the second material layers 121 rather than regions 9 remain exposed in the back side recesses 64.

Then, as shown in FIG. 4E, the blocking dielectric layer 7 (also known as an inter-poly dielectric, IPD) is then formed in the back side recesses 64 through the back side opening 84 such that the blocking dielectric coats the sides of the back side recesses 64 and the back side of layers 19 exposed in the back side opening 84. The blocking dielectric layer 7 may comprise a silicon oxide layer deposited by conformal atomic layer deposition (ALD) or chemical vapor deposition (CVD). Other high-k dielectric materials, such as hafnium oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 may have a thickness of 6 to 20 nm. An optional anneal, such as a rapid thermal anneal, may be conducted after the blocking dielectric formation.

The blocking dielectric layer 7 comprises a plurality of clam-shaped blocking dielectric segments 7a, 7b in the back side recesses 64 connected to each other by vertical portions 7c of the blocking dielectric layer 7 located on the exposed edges of the first material layers 19 in the back side opening 84. As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

The opening in the clam shaped blocking dielectric segments is then filled by a control gate 3 material. As described above, the control gate material may comprise a metal, such as tungsten or a heavily doped semiconductor, such as polysilicon. The control gate material may be deposited by CVD and fills the remaining volume of the back side recesses 64 inside the clam shaped blocking dielectric 7 segments and the entire back side opening 84. The deposition of the control gate material is followed by etching the control gate material to remove it from the back side opening 84 using anisotropic etching, while leaving the control gate material inside the back side recesses 64 in the clam shaped blocking dielectric 7 segments. The remaining control gate material inside the back side recesses 64 forms the control gates 3 of the vertical NAND string.

FIGS. 5A-5E illustrate a method of making a vertical NAND string according to another embodiment. The steps resulting in the structure shown in FIG. 5A are the same as described above with respect to FIG. 4A. However, in this embodiment, the front side recesses 62 shown in FIG. 4B are omitted. In this embodiment, the charge storage regions 9 are selectively grown on exposed edges of the sacrificial layers 121 exposed in the front side opening 81. Thus, as shown in FIG. 5B, the charge storage regions 9 protrude horizontally (i.e., parallel to the major surface 100a of the substrate 100) into the front side opening 81.

The process then proceeds in the same manner as described above with respect to FIGS. 4C-4E. Thus, the tunnel dielectric layer 11 and the channel 1 are formed in the front side opening 81, as shown in FIG. 5C. The sacrificial layers 121 are at least partially removed through the back side opening 84, as shown in FIG. 5D. Finally, the blocking dielectric 7 and the control gates 3 are formed through the back side opening as shown in FIG. 5E.

Thus, as shown in FIGS. 5D-5E, the plurality of vertically spaced apart charge storage regions 9 protrude into the tunnel dielectric 11 such that the tunnel dielectric 11 and the semiconductor channel 1 curve around the plurality of vertically spaced apart charge storage regions 9. Thus, the tunnel dielectric 11 of this embodiment has a curved rather than a straight sidewall.

FIGS. 6A-6E illustrate a method of making a vertical NAND string according to another embodiment using a back side silicide charge storage region 9 formation. The steps resulting in the structure shown in FIG. 6A are the same as described above with respect to FIG. 4A-4C or 5A-5C. Thus, the initial process steps may be the same as the steps shown in FIG. 4A-4C or 5A-5C and described above, to form either recessed or protruding semiconductor charge storage regions 9, tunnel dielectric 11 and channel 1 in the front side opening 81. In other words, FIG. 6A illustrates an in-process device at the same stage as either FIG. 4C or 5C.

Then, as shown in FIG. 6B, the back side opening 84 and the back side recesses 64 are formed, using steps similar to those described above with respect to FIG. 4D or 5D. The entire sacrificial material layers 121 are removed to expose the silicon (e.g., doped polysilicon) charge storage regions 9 in the back side recesses 64, as shown in FIG. 6B.

Then, after the second material layers 121 are removed to expose the polysilicon charge storage regions 9 in the back side recesses 64, a metal layer 610 is formed through the back side opening 84 in the back side recesses 64, such that portions 610a of the metal layer 610 are in contact with the polysilicon charge storage regions 9, as shown in FIG. 6C. The metal layer 610 may be formed using CVD or other deposition methods. The metal layer 610 may comprise any metal layer which may form a silicide when it reacts with silicon. For example, the metal layer may comprise tungsten, molybdenum, tantalum, titanium, nickel, cobalt, etc.

Following the metal layer 610 deposition step, the structure is annealed using any suitable silicidation anneal parameters to react portions 610a of the metal layer 610 with the silicon charge storage regions 9 to convert the silicon (e.g., polysilicon) charge storage regions to silicide charge storage regions 609 (e.g., 609a, 609b, etc.). The silicide charge storage regions may comprise tungsten silicide, molybdenum silicide, tantalum silicide, titanium silicide, nickel silicide, cobalt silicide, etc.

Preferably, the entire silicon charge storage regions 9 are converted to silicide charge storage regions 609 so that no unreacted silicon remains in the charge storage regions. Alternatively, only part of the silicon charge storage regions are converted to silicide charge storage regions 609, such that the charge storage regions comprise inner silicide portions adjacent to the blocking dielectric 7 and outer silicon portions adjacent to the tunnel dielectric 11. Then, as shown in FIG. 6D, the remaining unreacted portions 610b of the metal layer 610 are removed by any suitable selective wet etching without removing the silicide charge storage regions 609, as is typical in a silicide formation process.

The process then proceeds in the same manner as described above with respect to FIG. 4E or 5E, where the blocking dielectric 7 and the control gates 3 are formed through the back side opening 84 as shown in FIG. 6E.

FIGS. 7A-7E illustrate a method of making a vertical NAND string according to an alternative embodiment using a back side silicide formation. In this embodiment, portions 721 of the sacrificial semiconductor layers 121, such as polysilicon or amorphous silicon layer portions 721, remain in the back side recesses 64. The charge storage regions 9 may comprise semiconductor, metal or silicide regions in this embodiment.

The steps resulting in the structure shown in FIG. 7A are the same as described above with respect to FIG. 4A-4C or 5A-5C or 6A. Then, as shown in FIG. 6B, the back side opening 84 and the back side recesses 64 are formed, using steps similar to those described above with respect to FIG. 4D or 5D. Only parts of the entire sacrificial semiconductor material layers 121 are removed to leave portions 721 of the sacrificial semiconductor layers 121 exposed in the back side recesses 64, as shown in FIG. 7B.

Then, as shown in FIG. 7C, a metal layer 610 is formed through the back side opening 84 in the back side recesses 64, such that portions 610a of the metal layer 610 are in contact with the remaining portions 721 of the sacrificial semiconductor layers.

Following the metal layer 610 deposition step, the structure is annealed using any suitable silicidation anneal parameters to react portions 610a of the metal layer 610 with the portions 721 of the sacrificial semiconductor layers to convert the portions 721 of the sacrificial semiconductor layers to silicide storage regions 609 (e.g., 609a, 609b).

If the charge storage regions 9 comprise silicon (e.g., polysilicon), then the silicon charge storage regions 9 may also converted to silicide charge storage regions 609 together with portions 721 so that no unreacted silicon remains in the charge storage regions, similar to the structure shown in FIG. 6D.

Alternatively, as shown in FIG. 7D, only the portions 721 of the sacrificial semiconductor layers are converted to silicide charge storage regions 609, leaving initial charge storage regions 9 unconverted. This forms composite charge storage regions which comprise inner silicide portions 609 adjacent to the blocking dielectric 7 and outer silicon, silicide or metal portions 9 adjacent to the tunnel dielectric 11, as shown in FIG. 7D. Then, the remaining unreacted portions 610b of the metal layer 610 are removed by any suitable selective wet etching without removing the silicide charge storage regions 609, as is typical in a silicide formation process. The process then proceeds in the same manner as described above with respect to FIG. 4E or 5E, where the blocking dielectric 7 and the control gates 3 are formed through the back side opening 84 as shown in FIG. 7E.

FIGS. 8A-8B illustrate a method of making a vertical NAND string according to an alternative embodiment using a front side silicide formation. The steps resulting in the structure shown in FIG. 8A are the same as described above with respect to FIG. 4A-4C or 5A-5C or 6A, except for the deposition of the metal layer 810.

Thus, as shown in FIG. 8A, the stack 120 is formed and then patterned to form the front side opening 81. The charge storage regions 9 may be omitted if the sacrificial layers 121 comprise silicon (e.g., doped or undoped polysilicon or amorphous silicon), as shown in FIG. 8A. Alternatively, silicon (e.g., doped polysilicon) charge storage regions 9 may be selectively formed on the sacrificial layers 121 in the front side recesses 62, as shown in FIG. 4C, or protruding into the front side opening 81, as shown in FIG. 5C.

Then, a silicide forming metal layer 810 is formed in the front side opening 81. Layer 810 may comprise the same material as that described for layer 610 above. The metal layer 810 contacts the edges of the silicon sacrificial layers 121 if the charge storage regions 9 are not present or the metal layer 810 contacts the charge storage regions 9 if these regions are present in the front side opening 81.

The structure is then subjected to a silicidation anneal to react the metal layer 810 with the silicon regions exposed in the front side opening 81, as shown in FIG. 8B. For example, if the charge storage regions 9 are omitted as shown in FIG. 8A, then the metal layer 810 is reacted with the edge portions of the second (sacrificial silicon) material layers 121 exposed in the front side opening 81 to selectively form discrete silicide charge storage regions 809.

If the silicon charge storage regions 9 are present, then the metal layer 810 is reacted with the silicon charge storage regions 9 exposed in the front side opening 81 to convert all or parts of the silicon charge storage regions 9 to discrete silicide charge storage regions 809. If only the front parts of the silicon charge storage regions 9 are converted to silicide regions 809, then composite charge storage regions are formed. The composite charge storage regions comprise outer silicide portions 809 adjacent to the tunnel dielectric 11 and inner silicon portions 9 adjacent to the blocking dielectric 7, as shown in FIG. 8C.

Then, the remaining unreacted portions of the metal layer 810 are removed by any suitable selective wet etching without removing the discrete silicide charge storage regions 809, as is typical in a silicide formation process. The process then proceeds in the same manner as described above with respect to FIG. 4D-4E or 5D-5E, where the sacrificial layers 121 are removed through the back side opening 84 and then the blocking dielectric 7 and the control gates 3 are formed through the back side opening 84.

In another embodiment, the plurality of discrete semiconductor, metal or silicide charge storage regions 9, 609, 809 are nitrided to form nitrided charge storage regions. For example, any of the charge storage regions described above and shown in FIG. 4, 5, 6, 7 or 8 may be annealed in a nitrogen containing ambient, such nitrogen or NO radical ambient at an elevated temperature, to convert at least a portion of the charge storage region to a nitride material.

For example, the edge or outer portion of the charge storage regions exposed in the front side opening 81 may be converted to a nitride material prior to forming the tunnel dielectric layer 11, while the inner portion of the charge storage regions facing the blocking dielectric 7 may remain a semiconductor, metal or silicide material that is not nitrided. This results in a composite charge storage region. Alternatively, the entire volume of the charge storage material may be nitrided to convert the entire charge storage material to a nitride material.

For example, when the charge storage regions 9 comprise silicon (e.g., polysilicon), the nitridation forms a silicon nitride charge storage region. When the charge storage regions 9 comprise a metal (e.g., tungsten, tantalum, titanium, etc.), the nitridation forms a metal nitride (e.g., tungsten nitride, tantalum nitride, titanium nitride, etc.) charge storage region. Thus, the plurality of vertically spaced apart charge storage regions 9 in this embodiment comprise a nitrided metal.

FIGS. 9A-9E illustrate a method of making a vertical NAND string with a hybrid charge storage structure according to an alternative embodiment. In this embodiment, a silicon nitride charge storage layer 909 is provided in the front side opening 81 in contact with the plurality of discrete semiconductor, metal or silicide charge storage regions 9, 609, 809 described above to form a hybrid charge storage structure. Any of the charge storage regions described above and shown in FIG. 4, 5, 6, 7 or 8 may be combined with the silicon nitride charge storage layer 909 to form the hybrid charge storage structure.

For example, as shown in FIGS. 9A and 9B, the structure described above with respect to FIGS. 5A and 5B having the metal or semiconductor charge storage regions 9 protruding into the front side opening 81 is formed. Then, the silicon nitride layer 909 is formed in the front side opening 81 in contact with the charge storage regions 9, as shown in FIG. 9C. While silicon nitride is a preferred material for layer 909, other continuous dielectric (i.e., electrically insulating) materials, such as silicon oxynitride, may be used instead or in addition to silicon nitride. Thus, a continuous dielectric charge storage layer 909 is located in contact with the plurality of vertically spaced apart charge storage regions 9.

The process then proceeds in the same manner as described above with respect to FIG. 4D-4E or 5D-5E where the sacrificial layers 121 are removed through the back side opening 84 and then the blocking dielectric 7 and the control gates 3 are formed through the back side opening 84. If desired, at least a part of the charge storage regions may be converted to a silicide using the back side silicidation process described above with respect to FIG. 6D-6E or 7D-7E. Alternatively, at least a part of the metal or semiconductor charge storage regions may be converted to a silicide or a nitride using the front side silicidation process (as shown in FIGS. 8A-8C) or front side nitridation process described above.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
    forming a stack of alternating layers of a first material and a second material over a substrate, wherein the first material comprises an electrically insulating material and wherein the second material comprises a sacrificial material;
    etching the stack to form a front side opening in the stack;
    selectively forming a plurality of discrete semiconductor, metal or silicide charge storage regions on portions of the second material layers exposed in the front side opening;
    forming a tunnel dielectric layer over the charge storage regions in the front side opening;
    forming a semiconductor channel layer over the tunnel dielectric layer in the front side opening;
    etching the stack to form a back side opening in the stack;
    removing at least a portion of the second material layers through the back side opening to form back side recesses between the first material layers;
    forming a blocking dielectric in the back side recesses through the back side opening; and
    forming control gates over the blocking dielectric in the back side recesses through the back side opening,
    wherein the step of selectively forming a plurality of discrete semiconductor, metal or silicide charge storage regions comprises selectively growing metal or silicide charge storage regions on the portions of the second material layers exposed in the front side opening.

2. The method of claim 1, wherein the second material comprises polysilicon or amorphous silicon.

3. The method of claim 2, wherein the second material comprises intrinsic or undoped polyliscon and the charge storage regions comprise polysilicon regions.

4. The method of claim 3, wherein the step of selectively forming the plurality of discrete semiconductor, metal or silicide charge storage regions comprises selectively growing doped polysilicon regions on the portions of the second material layer exposed in the front side opening.

5. The method of claim 4, wherein the doped polysilicon regions comprise boron doped, p-type polysilicon regions and wherein the doped polysilicon regions are not grown on portions of the first material layers exposed in the front side opening.

6. The method of claim 3, wherein the step of selectively forming a plurality of discrete semiconductor, metal or silicide charge storage regions comprises doping the portions of the second material layer exposed in the front side opening.

7. The method of claim 3, further comprising:
    forming a metal layer through the back side opening in the back side recesses in contact with the polysilicon charge storage regions after the step of removing at least a portion of the second material layers removes all second material layers to expose the polysilicon charge storage regions in the back side recesses;
    reacting the metal layer with the polysilicon charge storage regions to convert the polysilicon charge storage regions to silicide charge storage regions; and
    selectively removing unreacted portions of the metal layer without removing the silicide charge storage regions.

8. The method of claim 3, further comprising:
forming a metal layer through the back side opening in the back side recesses in contact with remaining portions of the second material layers remaining after the step of removing at least a portion of the second material layers;
reacting the metal layer with the remaining portions to form discrete silicide regions in the back side recesses in contact with the charge storage regions; and
selectively removing unreacted portions of the metal layer without removing the silicide regions.

9. The method of claim 2, wherein the step of selectively forming the plurality of discrete semiconductor, metal or silicide charge storage regions comprises:
forming a metal layer in the front side opening;
reacting the metal layer with the portions of the second material layer exposed in the front side opening to form discrete silicide charge storage regions; and
selectively removing unreacted portions of the metal layer without removing the discrete silicide charge storage regions.

10. The method of claim 1, further comprising nitriding the plurality of discrete semiconductor, metal or silicide charge storage regions to form nitrided charge storage regions.

11. The method of claim 1, further comprising forming a silicon nitride charge storage layer in the front side opening in contact with the plurality of discrete semiconductor, metal or silicide charge storage regions to form a hybrid charge storage structure.

12. The method of claim 1, further comprising recessing the second material layers in the front side opening to form front side recesses, such that the step of selectively forming a plurality of discrete semiconductor, metal or silicide charge storage regions selectively forms the plurality of discrete semiconductor, metal or silicide charge storage regions in the front side recesses.

13. The method of claim 1, wherein the step of selectively forming the plurality of discrete semiconductor, metal or silicide charge storage regions selectively forms the plurality of discrete semiconductor, metal or silicide charge storage regions which protrude into the front side opening.

14. The method of claim 1, wherein:
at least one end portion of the semiconductor channel extends vertically in a substantially perpendicular direction to a major surface of the substrate; and
the plurality of discrete semiconductor, metal or silicide charge storage regions comprise a plurality of vertically spaced apart floating gates.

15. The method of claim 12, wherein the step of selectively forming the plurality of discrete semiconductor, metal or silicide charge storage regions selectively forms the plurality of discrete semiconductor, metal or silicide charge storage regions in the front recesses such that a plurality of discrete semiconductor, metal or silicide charge storage regions protrude into the front side opening.

16. The method of claim 12, wherein the step of selectively forming the plurality of discrete semiconductor, metal or silicide charge storage regions selectively forms the plurality of discrete semiconductor, metal or silicide charge storage regions in the front recesses such that edges of the plurality of discrete semiconductor, metal or silicide charge storage regions are substantially even with edges of the first material in the front side opening.

17. The method of claim 12, wherein the step of selectively forming the plurality of discrete semiconductor, metal or silicide charge storage regions selectively grows the plurality of discrete semiconductor, metal or silicide charge storage regions on the portions of the second material layers exposed in the front recesses in the front side opening but not on portions of the first material layers exposed in the front side opening.

* * * * *